United States Patent
Sakurai et al.

(10) Patent No.: US 6,201,825 B1
(45) Date of Patent: Mar. 13, 2001

(54) SURFACE EMITTING SEMICONDUCTOR LASER DEVICE AND PROCESS FOR PRODUCING THE SAME

(75) Inventors: Jun Sakurai; Hideo Nakayama; Hiromi Otoma; Yasuaki Miyamoto, all of Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/320,711

(22) Filed: May 27, 1999

(30) Foreign Application Priority Data

May 29, 1998 (JP) .................................................. 10-149270

(51) Int. Cl.[7] .................................................... H01S 3/082
(52) U.S. Cl. ................................. 372/96; 372/45; 372/96; 257/13; 257/17; 438/35
(58) Field of Search ................................ 438/35; 372/45, 372/96, 50, 23, 46, 101, 44; 359/248; 257/190, 191, 17, 18, 94

(56) References Cited

U.S. PATENT DOCUMENTS

| | | | |
|---|---|---|---|
| 6,026,111 | * 2/2000 | Wenbin | 372/96 |
| 6,028,693 | * 2/2000 | Fork | 359/248 |
| 6,031,243 | * 2/2000 | Taylor | 257/13 |
| 6,055,262 | * 4/2000 | Cox | 372/96 |
| 6,061,381 | * 5/2000 | Adams | 372/96 |
| 6,084,898 | * 7/2000 | Heffernan | 372/45 |
| 6,097,041 | * 8/2000 | Lin | 257/98 |
| 6,116,756 | * 9/2000 | Chang et al. | 362/285 |
| 6,117,699 | * 9/2000 | Lemoff | 438/35 |
| 6,122,109 | * 9/2000 | Peake | 359/620 |

OTHER PUBLICATIONS

Huffaker, D. L., et al. "Native–Oxide Defined Ring Contact for Low Threshold Vertical–Cavity Lasers", *Appl. Phys. Lett.*, 65 (1), Jul. 4, 1994, pp. 97–99.

Lear, K. L., et al. "Life–Testing Oxide Confined VCSELs: Too Good to Last?", *SPIE*, vol. 2683, pp. 114–122.

Choquette, K. D., et al. "Low Threshold Voltage Vertical–Cavity Lasers Fabricated by Selective Oxidation", *Electronics Letters*, vol. 30, No. 24, Nov. 24, 1994, pp. 2043–2044.

Choquette, Kent D., et al. "Selective Oxidation of Buried AlGaAs Versus AlAs Layers", *Appl. Phys. Lett.*, 69 (10), Sep. 2, 1996, pp. 1385–1387.

Takahashi, M., et al. "Oxide–Confinement Vertical–Cavity Surface–Emitting Lasers Grown on GaAs(311)A Substrates with Dynamically Stable Polarisation", *Electronic Letters*, vol. 34, No. 3, Feb. 5, 1998, pp. 276–278.

* cited by examiner

*Primary Examiner*—John F. Niebling
*Assistant Examiner*—Andre C Stevenson
(74) *Attorney, Agent, or Firm*—Oliff & Berridge

(57) ABSTRACT

It is to provide a surface emitting semiconductor laser device having a long life time and uniform light output characteristics.

A periphery of an upper surface and a side surface of a mesa structure is covered with a silicon oxide nitride film 34 as an inorganic insulating film, the mesa structure comprising a lower DBR 16 of a first conductive type formed on a first primary surface of an n-type GaAs substrate 12, having formed thereon an active region 24, an upper DBR 26 containing an AlAs layer 32 as the lowermost layer, and a p-type GaAs contact layer 28.

7 Claims, 4 Drawing Sheets

SURFACE EMITTING SEMICONDUCTOR LASER DEVICE AND PROCESS FOR PRODUCING THE SAME

BACKGROUND OF THE INVENTION

1. Field of the Invention

The present invention relates to a surface emitting semiconductor laser device and a process for producing the same, and, particularly, relates to a so-called selective oxidation type surface emitting semiconductor laser device and a process for producing the same.

2. Description of the Related Art

A highly densified semiconductor laser array is demanded as a light source of light communication and an optical computer. In a semiconductor laser array, plural semiconductor laser devices are arranged at certain intervals, and the laser devices are controlled independently. A edge emitting semiconductor laser device is not suitable as a semiconductor laser array because it can only be one-dimensionally arranged on one substrate. On the other hand, a surface emitting semiconductor laser device is promising because it can be two-dimensionally arranged on one substrate to have an advantage in production of a matrix array of high precision and high density.

A vertical cavity surface emitting semiconductor laser device, as one of the surface emitting semiconductor laser device, comprises an active region comprising an active layer and a spacer layer, and a pair of distributed Bragg reflectors (DBR) sandwiching the active region, in which an oscillator is constituted by the DBR, which emits light in a normal direction with respect to the substrate. The surface emitting semiconductor laser device is characterized in that the emission angle is small, the longitudinal mode interval is large, and an array can be easily formed, in comparison with the facet radiation semiconductor laser device.

An example of the vertical resonance surface emitting semiconductor laser device is a so-called selective oxidation surface emitting semiconductor laser device, which is obtained by inserting $Al_xGa_{1-x}As$ ($0.98 \leq x \leq 1$) in the vicinity of the active region, and oxidizing the outer periphery of the inserted $Al_xGa_{1-x}As$ with steam to realize electric current confinement. One example thereof disclosed in *Appl. Phys. Lett.*, vol. 65, No. 1, p. 97–99 (1994) has the structure shown in FIG. 4, in which a triple quantum well active layer comprising $In_{0.2}Ga_{0.8}As$ is sandwiched by a DBR comprising GaAs/AlAs, provided that the p-type DBR comprises only a pair of GaAs/AlAs, and the GaAs layer is attached as the upper layer. In the production of the selective oxidation surface emitting semiconductor laser device, the p-type GaAs is first worked into a circular shape having a diameter of 30 or 60 μm by using a photolithography process and a wet etching process. The exposed p-type AlAs layer is then subjected to a heat treatment in a furnace heated to 475° C. for about 3 minutes. On the heat treatment, steam is obtained by bubbling nitrogen, as a carrier gas, in deionized water maintained at 95° C., has already been introduced in the furnace. The exposed AlAs layer is gradually oxidized in the horizontal direction, and finally a region of from 2 to 8 μm square is formed that remains not oxidized. The oxidized region becomes aluminum oxide, which substantially does not let an electric current pass, to realize electric current confinement, and a refractive index distribution is formed between the aluminum oxide thus formed and the AlAs remaining to lower the threshold electric current.

One example thereof disclosed in SPIE, vol. 2683, p. 114–122 (1996) has the structure shown in FIG. 5, in which a triple quantum well active region comprising InGaAs is sandwiched by a pair of semiconductor DBRs. Layers of $Al_{0.98}Ga_{0.02}As$ are inserted on and below the active region, and, after forming a mesa structure by etching until both the $Al_{0.98}Ga_{0.02}As$ layers are exposed, the $Al_{0.98}Ga_{0.02}As$ layers are then oxidized by using steam. The literature describes that a life time of 2,500 hours or more could be obtained by inserting the $Al_{0.98}Ga_{0.02}As$ layers in the vicinity of the active region.

However, in the case where $Al_{0.98}Ga_{0.02}As$ having a high Al concentration is oxidized with steam by using nitrogen as a carrier gas, a slight fluctuation of the Ga concentration influences the oxidation rate as shown in *Electronics Lett.*, vol. 30, No. 24, p. 2043–2044 (1994). For example, the oxidation rate of AlAs is five times that of $Al_{0.98}Ga_{0.02}As$. Because the size of the electric current confinement region obtained by oxidizing a part of the $Al_xGa_{1-x}As$ largely influences the threshold electric current and the horizontal mode stability of the surface emitting semiconductor laser device, the control of the oxidation rate, i.e., the control of the composition of the $Al_xGa_{1-x}As$, is important in production of a device having uniform optical output characteristics with good reproducibility. However, techniques required in the composition control of the $Al_xGa_{1-x}As$, for example, the flow rate control, is of a more advanced nature than that in the DBR and the active region.

In the case where AlAs (x=1) is used, the composition control becomes easier than the case of $Al_xGa_{1-x}As$ (x≠1), and the uniformity and the reproducibility of the device are increased. However, as described in *Appl. Phys. Lett.*, vol. 69, No. 10, p. 1385–1387 (1996), there is a tendency that the mesa structure is dropped off after sudden temperature rise after oxidation (which is considered to correspond to a heat treatment to form an ohmic contact of the upper electrode), and the life time of the surface emitting semiconductor laser device is as short as 100 hours or less.

SUMMARY OF THE INVENTION

The invention has been developed to solve the problems associated with the conventional technique.

An object of the invention is to provide a surface emitting semiconductor laser device having uniform optical output characteristics and a long lifetime, and a process for producing the surface emitting semiconductor laser device. The invention relates to, as a first embodiment, a surface emitting semiconductor laser device comprising a substrate, a distributed Bragg reflector film of a first conductive type formed on a first principal surface of the substrate, an active region formed on the reflector film, a distributed Bragg reflector film of a second conductive type formed on the active layer, and a control layer formed by oxidizing a part of at least one AlAs layer in the vicinity of the active layer, a mesa structure containing from an upper part of the distributed Bragg reflector layer of the second conductive type through the control layer being formed, wherein an inorganic insulating film is laminated to cover a peripheral part of an upper surface and a side surface of the mesa structure.

The invention also relates to, as a second embodiment, a surface emitting semiconductor laser device comprising an insulating substrate, a buffer layer of a first conductive type formed on the insulating substrate, a distributed Bragg reflector film of the first conductive type formed on the buffer layer, an active region formed on the reflector film, a distributed Bragg reflector film of a second conductive type formed on the active layer, and a control layer formed by oxidizing a part of at least one AlAs layer in the vicinity of the active layer, plural mesa structures containing from the distributed Bragg reflector layer of the second conductive type through the buffer layer being formed, wherein an inorganic insulating film is laminated to cover a peripheral part of an upper surface and a side surface of the mesa structures, and an organic film is laminated in the region among the respective mesa structures.

The inorganic insulating film may comprise silicon oxide, silicon nitride and/or silicon oxide nitride, and the inorganic insulating film may be formed by a plasma-assisted chemical vapor deposition method.

The invention further relates to, as a third embodiment, a process for producing a surface emitting semiconductor laser device comprising the steps of: laminating, on an insulating substrate, a buffer layer of a first conductive type, a distributed Bragg reflector film of the first conductive type, an active region, at least one AlAs layer in a vicinity of the active region, a distributed Bragg reflector film of a second conductive type, and a contact layer having the second conductive type; forming plural mesa structures containing from the contact layer through the distributed Bragg reflector film of the first conductive type; selectively oxidizing a part of the AlAs layer; forming, on the buffer layer, a lower electrode capable of forming an ohmic contact with the buffer layer; laminating an inorganic insulating film to cover the mesa structures; removing a part of the inorganic insulating film and the buffer layer to make the respective mesa structures independent, so as to complete the mesa structures; laminating an organic insulating film to be embedded in regions among the respective mesa structures; removing the organic insulating film until the inorganic insulating film on an upper surface of the mesa structures is exposed; removing the central part of the inorganic insulating film on the upper surface of the mesa structures; and forming an upper electrode in contact with an exposed part on the upper surface of the mesa structures.

DETAILED DESCRIPTION OF THE INVENTION

Figure 1:
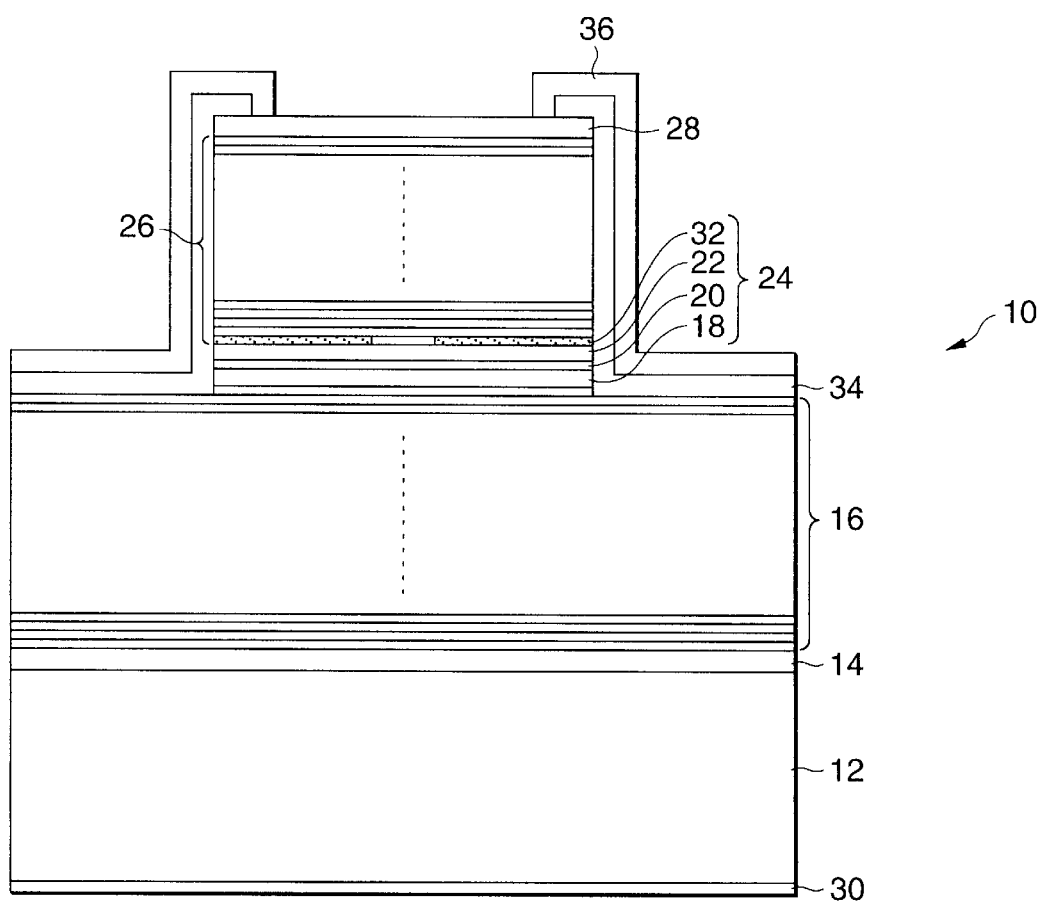
FIG. 1 is a cross-sectional view showing a surface emitting semiconductor laser device of Example 1 according to the invention.

The surface emitting semiconductor laser device according to the invention comprises a substrate, a distributed Bragg reflector film of a first conductive type formed on the substrate, an active region formed on the reflector film, a distributed Bragg reflector film of a second conductive type formed on the active layer to face the distributed Bragg reflector film of the first conductive type, and a control layer formed by oxidizing at least one AlAs layer in a vicinity of the active layer, and a mesa structure containing from an upper part of the distributed Bragg reflector layer of the second conductive type through the control layer is formed. The control layer may be formed above the active region or may be formed under the active region. In the case where the control layer is formed above the active region, the control layer may be the undermost layer of the distributed Bragg reflector film of the second conductive type. A contact layer having the second conductive type may be formed on the distributed Bragg reflector film of the second conductive type, and in this case, the mesa structure contains the contact layer. A buffer layer of the first conductive type may be formed between the substrate and the distributed Bragg reflector film of the first conductive type. The surface emitting semiconductor laser device of the invention may have plural mesa structures. In this case, the substrate comprises an insulating material to insulate the respective mesa structures; a buffer layer of the first conductive type is formed between the substrate and the distributed Bragg reflector film of the first conductive type; and the mesa structure contains from the distributed Bragg reflector layer of the second conductive type (or the contact layer when it exists) to the buffer layer.

As the substrate used in the invention, materials known has a substrate, such as GaAs, InP, AlGaAs and sapphire, may be used. As the buffer layer, GaAs may be used. As the distributed Bragg reflector film, AlGaAs and GaAs may be used. In order to withdraw emission light from the upper surface of the mesa structure, the reflectivity of the distributed Bragg reflector film of the first conductive type must be higher than that of the distributed Bragg reflector film of the second conductive type. As the active region, GaAs, InGaAs, InGaAsP and GaInNAs may be used. As the contact layer of the second conductive type, GaAs or the like may be used. The layers and the substrate are subjected to doping depending on necessity. As a dopant, silicon or selenium may be used for n-type, and carbon, zinc, or magnesium may be used for p-type.

In the invention, an inorganic insulating film is formed to cover the peripheral part of the upper surface and the side surface of the mesa structure. As the inorganic insulating film, silicon oxide, silicon nitride and/or silicon oxide nitride may be used.

In the case where the surface emitting semiconductor laser device of the invention has plural mesa structures, an organic film is embedded in regions among the respective mesa structures. It is preferred that the organic film is completely fills the steps among the respective mesa structures. As the organic film, a polyimide having high heat resistance may be used. Even in the case where the surface emitting semiconductor laser device of the invention has a single mesa structure, an organic film may be formed to fill the steps formed due to the formation of the mesa structure.

A process for producing the surface emitting semiconductor laser device will be described below. A buffer layer of a first conductive type is formed on a substrate (in the case where plural mesa structures are formed); a distributed Bragg reflector film of the first conductive type is formed on the substrate or the buffer layer of the first conductive type; an active region is formed on the distributed Bragg reflector film of the first conductive type; at least one AlAs layer is formed above or under the active region in the vicinity of the active region; a distributed Bragg reflector film of a second conductive type is formed on the active region or the AlAs layer; and a contact layer of the second conductive type is formed on the distributed Bragg reflector film of the second conductive type (depending on necessity). In the case where a single mesa structure is formed, a lower electrode is formed on the surface of the substrate opposite to the surface on which the layers described above are formed. As a method for forming the buffer layer of the first conductive type, the distributed Bragg reflector film of the first conductive type, the active region, the AlAs layer, the distributed Bragg reflector film of the second conductive type and the contact layer of the second conductive type, an MOCVD method and an MEB method may be used. As a method for forming the electrode, a vapor deposition method, an ion plating method and a sputtering method may be used.

A mesa structure containing from the contact layer (or the upper part of the distributed Bragg reflector film of the second conductive type when no contact layer exists) through the AlAs layer is then formed. In this case, the active layer of the active region is contained in the mesa structure. Therefore, in the case where the AlAs layer is arranged under the active region, the mesa structure is formed to contain from the contact layer or the distributed Bragg reflector film of the second conductive type through at least the AlAs layer, and in the case where the AlAs layer is arranged above the active region, the mesa structure is formed to contain a spacer layer, which is generally arranged under the active region, and a part of the distributed Bragg reflector film of the first conductive type. In the case where plural mesa structures are formed, the mesa structures are formed to contain through the distributed Bragg reflector film of the first conductive type. A part of the AlAs layer is then selectively oxidized. Thereafter, in the case where plural mesa structures are formed, a metal capable of forming an ohmic contact with the buffer layer is deposited at the prescribed position by a lift-off method to form a lower electrode. That is, after forming a resist pattern, a metal is deposited by a vapor deposition, for example, and the metal formed on the resist is removed along with the resist to leave the metal in directly contact with the buffer layer.

After the oxidation of the AlAs layer (in the case where the single mesa structure is formed) or after the formation of the lower electrode (in the case where the plural mesa structures are formed), an inorganic insulating film is laminated to cover the mesa structure. As a method for lamination, a plasma-assisted chemical vapor deposition method, which can form a dense film at low temperature, is preferred. In the case where the plural mesa structures are formed, a part of the inorganic insulating film and the buffer layer are removed by a photolithography process or a reactive etching process, to make the respective mesa structures independent. Subsequently, in the case where the plural mesa structures are formed, an organic insulating film is laminated to be embedded in regions among the respective mesa structures. The organic insulating film is then removed by chemical and mechanical polishing until the inorganic insulating film on the upper surface of the mesa structures is exposed, and the central part of the inorganic insulating film on the upper surface of the mesa structures is removed by photolithography and etching. Finally, a metal is formed in contact with an upper surface and a side surface of the inorganic insulating film and an exposed part on the upper surface of the mesa structure (i.e., a part from which the inorganic insulating film is removed) by a lift-off method, to produce an upper electrode. As a metal that can be used as the upper and lower electrodes, titanium, gold, platinum, zinc, an alloy thereof and a combination thereof may be exemplified.

The invention will be described in detail with reference to the drawings.

EXAMPLES

Example 1

FIG. 1 is a cross-sectional view of a surface emitting semiconductor laser device 10 of the first embodiment. Upon production of the surface emitting semiconductor laser device 10, an n-type GaAs buffer layer 14, a lower DBR 16, an active region 24 comprising a lower spacer layer 18 comprising undoped $Al_{0.6}Ga_{0.4}As$, a quantum well active layer 20 comprising an undoped $Al_{0.11}Ga_{0.89}As$ quantum well layer and an undoped $Al_{0.3}Ga_{0.7}As$ barrier layer, and an upper spacer layer 22 comprising undoped $Al_{0.6}Ga_{0.4}As$, an upper DBR 26, and a p-type GaAs contact layer 28 were laminated in this order on an n-type GaAs substrate 12. A laminated film of AuGe/Au was allowed to adhere on the surface of the n-type GaAs substrate 12 opposite to the surface on which the layers described above were formed to form an n-type electrode 30. The lower DBR 16 was formed by alternately laminating n-type $Al_{0.9}Ga_{0.1}As$ and p-type $Al_{0.3}Ga_{0.7}As$ to a thickness of $\lambda/(4n_r)$ ($\lambda$: oscillation wavelength, $n_r$: refractive index of media) for each by 40.5 cycles, in which the silicon concentration as a dopant was $2\times10^{18}$ cm$^{-3}$. The upper DBR 26 was formed by alternately laminating p-type $Al_{0.9}Ga_{0.1}As$ and p-type $Al_{0.3}Ga_{0.7}As$ to a thickness of $\lambda/(4n_r)$ for each by 30 cycles, in which the carbon concentration as a dopant was $3\times10^{18}$ cm$^{-3}$. As the lowermost layer of the upper DBR 26, a p-type AlAs layer 32 was formed as a control layer instead of the p-type $Al_{0.9}Ga_{0.1}As$. The p-type AlAs layer 32 had a thickness of $\lambda/(4n_r)$ and a carbon concentration as a dopant of $3\times10_{18}$cm$^{-3}$. The number of cycles (number of layers) of the upper DBR 26 was smaller than that of the lower DBR 16 because the reflectivity of the upper DBR 26 was made smaller than that of the lower DBR 16 to withdraw emission light from the side of the contact layer. In order to lower the series resistance of the device, a so-called transition region was formed between the $Al_{0.9}Ga_{0.1}As$ layer and the $Al_{0.3}Ga_{0.7}As$ layer in the lower DBR 16 and the upper DBR 26, in which the aluminum composition of the transition region is intermediate between the $Al_{0.9}Ga_{0.1}As$ layer and the $Al_{0.3}Ga_{0.7}As$ layer. The p-type GaAs contact layer 28 had a thickness of 20 nm and a carbon concentration of $1\times10^{20}$ cm$^{-3}$.

A mesa structure was formed from the p-type GaAs contact layer 28 through a part of the lower DBR 16 by reactive ion etching using a gas of boron trichloride and chlorine ($BCl_3+Cl_2$). Subsequently, the AlAs layer 32 was heated to 400° C. in a wet oxidation furnace, into which steam formed by bubbling nitrogen as a carrier gas in deionized water heated to 95° C. was introduced, to selectively oxidize a part of the AlAs layer 32. A silicon oxide nitride film 34 having a thickness of about 1 μm was then formed to cover the mesa structure by a plasma-assisted chemical vapor deposition method at 250° C. A contact hole was formed by removing the silicon oxide nitride film 34 from the central part of the upper surface of the mesa structure by photolithography and etching. A laminated film of Ti/Au as a p-type electrode 36 was formed at the prescribed position by a lift-off method to connect the p-type electrode 36 to the p-type GaAs contact layer 28, so that an emission hole was formed.

The device of this example had the constitution described above, and laser light having an oscillation wavelength $\lambda$ of 780 nm was withdrawn from the emission hole.

Figure 3:
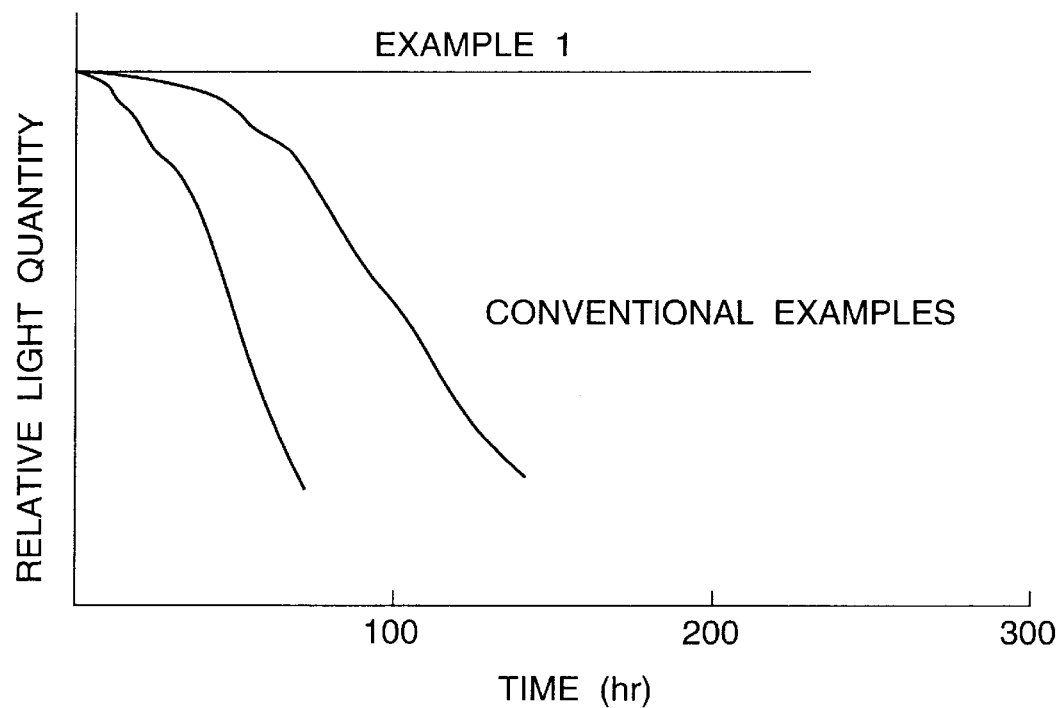
FIG. 3 is a graph showing a result of a life time test of a surface emitting semiconductor laser device produced in Example 1.
Figure 4:
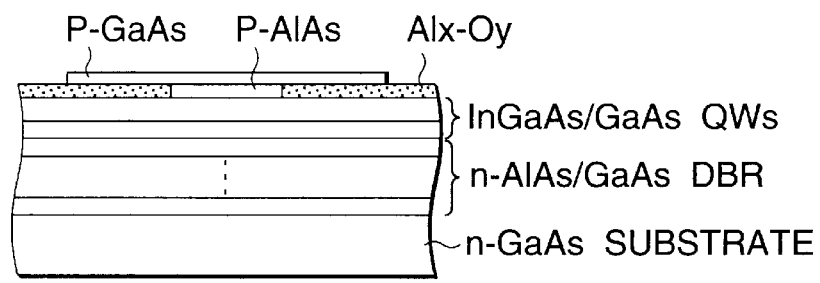
FIG. 4 is a cross-sectional view showing a conventional surface emitting semiconductor laser device.
Figure 5:
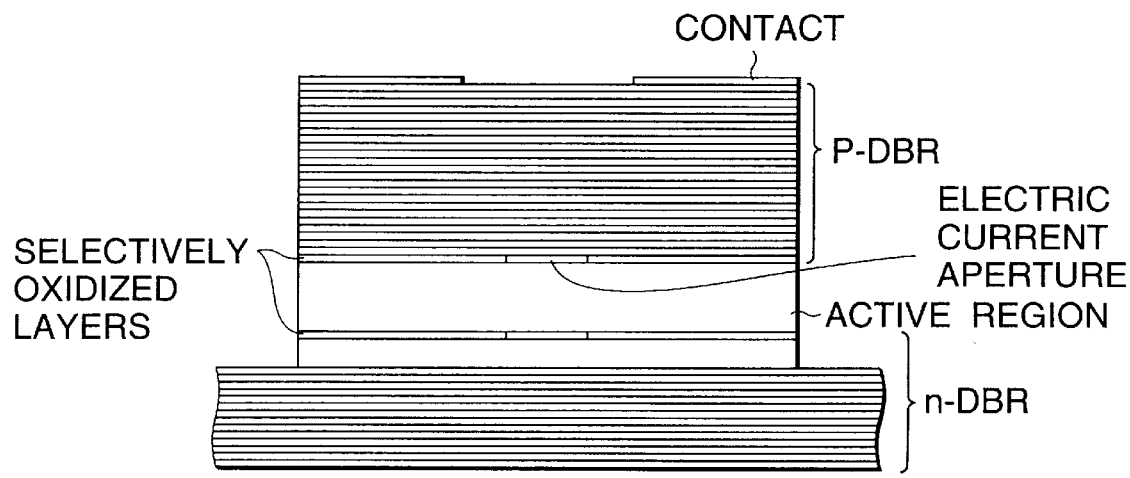
FIG. 5 is a cross-sectional view showing another conventional surface emitting semiconductor laser device.

An electric current of 3 mA was applied between the n-type electrode 30 and the p-type electrode 36 of the device at room temperature to conduct laser oscillation. The results obtained are shown in FIG. 3. It is understood from the figure that, in the device of this example, the output is unchanged for a period of 200 hours or more, and an extremely stable normal radiation laser device is obtained even when an AlAs layer is used as an electric current confinement layer.

In the surface emitting semiconductor laser device 10, while the silicon oxide nitride film 34 covers a part other than the mesa structure, it is possible to cover only the peripheral part and the side surface of the mesa structure as far as drop-off of the mesa structure can be prevented.

Example 2

Figure 2:
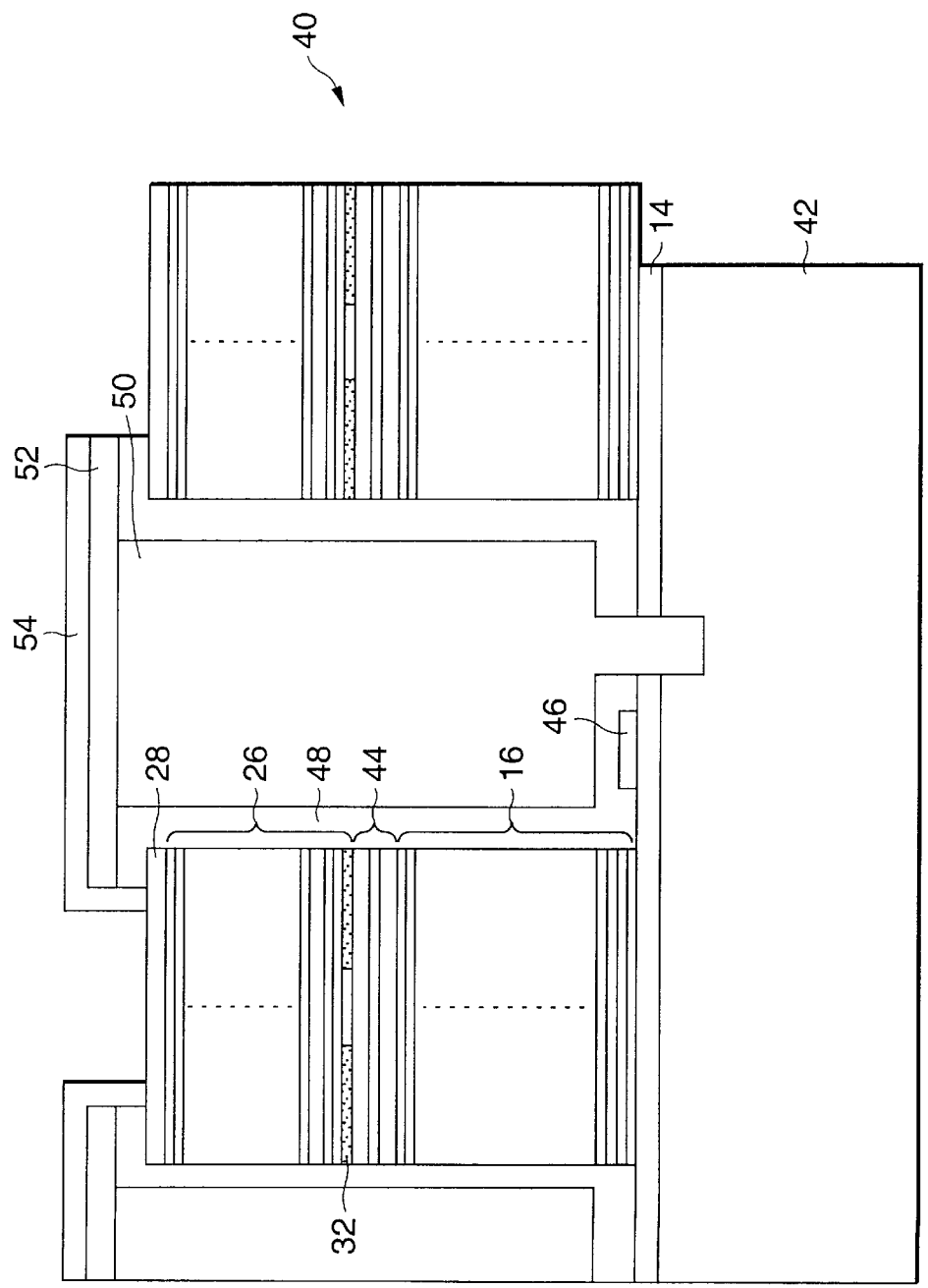
FIG. 2 is a cross-sectional view showing a surface emitting semiconductor laser device of Example 2 according to the invention.

FIG. 2 is a cross-sectional view of a surface emitting semiconductor laser device 40 of the second embodiment. In the constitution of the surface emitting semiconductor laser device 40, the same components as in the surface emitting semiconductor laser device 10 are marked with the same symbols to omit the descriptions therefor. Upon production of the surface emitting semiconductor laser device 40, an n-type GaAs buffer layer 14, a lower DBR 16, an active region 44 comprising a quantum well active layer comprising $Al_{0.9}Ga_{0.1}As$ quantum well layer sandwiched by undoped $Al_{0.6}Ga_{0.4}As$ and an undoped $Al_{0.3}Ga_{0.7}As$ barrier layer, an upper DBR 26, and a p-type GaAs contact layer 28 were laminated in this order on an undoped GaAs substrate 42. Mesa structures were formed from the p-type GaAs contact layer 28 through the lower DBR 16 by photolithography and reactive ion etching using a gas of boron trichloride and chlorine ($BCl_3+Cl_2$) to expose the n-type GaAs buffer layer 14. Subsequently, the AlAs layer 32 was heated to 400° C. in a wet oxidation furnace,. into which steam formed by bubbling nitrogen as a carrier gas in deionized water heated to 95° C. was introduced, to selectively oxidize a part of the AlAs layer 32. Furthermore, an n-type electrode 46 comprising a laminated film of AuGe/Au was formed at the prescribed position of the part, at which the n-type GaAs buffer layer 14 is exposed, by a lift-off method. A silicon oxide nitride film 48 having a thickness of about 1 $\mu$m was then formed to cover the mesa structures by a plasma-assisted chemical vapor deposition method at 250° C. Subsequently, a part of the silicon oxide nitride film 48, the n-type GaAs buffer layer 14 and the undoped GaAs substrate 42 on a part arranged among the mesa structures was removed by photolithography and etching, to complete the mesa structures and to make the respective mesa structures independent. A polyimide 50 was formed among the mesa structures to fill the steps. The polyimide 50 was removed by mechanical and chemical polishing to expose the part of the silicon oxide nitride film 48 positioned on the p-type GaAs contact layer 28. A silicon oxide nitride film 52 having a thickness of about 1 $\mu$m was formed by a plasma-assisted chemical vapor deposition method at 230° C. Subsequently, the silicon oxide nitride films 48 and 52 were removed from the central part of the upper surface of the mesa structures to form contact holes. A laminated film of Ti/Au as a p-type electrode 54 was formed at the prescribed position by a lift-off method to connect the p-type electrode 54 to the p-type GaAs contact layer 28, so that emission holes were formed.

The device of this example has the constitution described above, and laser light having an oscillation wavelength $\lambda$ of 780 nm is withdrawn from the emission hole by applying an electric current between the n-type electrode 46 and the p-type electrode 54.

In the device of this example, by forming the inorganic insulating film to cover the mesa structures, drop-off of the mesa structures can be prevented even when the AlAs layer is used as the electric current confinement layer, to obtain an extremely stable normal radiation laser device. The steps at the region among the mesa structures can be diminished or eliminated by completely filling the polyimide into the region to prevent disconnection of the p-type electrode and to increase the yield of wiring. Furthermore, unnecessary leakage can be prevented by the polyimide. By covering the mesa structures with the inorganic insulating film, the VCSEL can be prevented from damage on flattening the polyimide by mechanical and chemical polishing to increase the yield.

In the first embodiment of the invention, a surface emitting semiconductor laser device, in which the drop-off of the mesa structure is prevented, the life time is long, and the light output characteristics are uniform, can be provided by covering the periphery of the upper surface and the side surface of the mesa structure containing the AlAs layer with the inorganic insulating film.

In the second embodiment of the invention, drop-off of the mesa structures is prevented by covering the periphery of the upper surface and the side surface of the mesa structures with the inorganic insulating film, and disconnection of the electrode and unnecessary leakage can be prevented by filling the region among the mesa structures with an organic film.

In the third embodiment of the invention, a surface emitting semiconductor laser device having a long life time and uniform light output characteristics can be produced with good reproducibility.

What is claimed is:

1. A surface emitting semiconductor laser device comprising a substrate, a distributed Bragg reflector film of a first conductive type formed on a first principal surface of said substrate, an active region formed on said reflector film, a distributed Bragg reflector film of a second conductive type formed on said active layer, and a control layer formed by oxidizing a part of at least one AlAs layer in the vicinity of said active layer, a mesa structure containing from an upper part of said distributed Bragg reflector layer of said second conductive type through said control layer being formed, wherein an inorganic insulating film is laminated to cover a peripheral part of an upper surface and a side surface of said mesa structure.

2. A surface emitting semiconductor laser device as claimed in claim 1, wherein said inorganic insulating film comprises silicon oxide, silicon nitride and/or silicon oxide nitride.

3. A surface emitting semiconductor laser device as claimed in claim 2, wherein said inorganic insulating film is formed by a plasma-assisted chemical vapor deposition method.

4. A surface emitting semiconductor laser device comprising an insulating substrate, a buffer layer of a first conductive type formed on said insulating substrate, a distributed Bragg reflector film of said first conductive type formed on said buffer layer, an active region formed on said reflector film, a distributed Bragg reflector film of a second conductive type formed on said active layer, and a control layer formed by oxidizing a part of at least one AlAs layer in a vicinity of said active layer, plural mesa structures containing from said distributed Bragg reflector layer of the second conductive type through said buffer layer being formed, wherein an inorganic insulating film is laminated to cover a peripheral part of an upper surface and a side surface of said mesa structures, and an organic films is laminated in the region among the respective mesa structures.

5. A surface emitting semiconductor laser device as claimed in claim 4, wherein said inorganic insulating film comprises silicon oxide, silicon nitride and/or silicon oxide nitride.

6. A surface emitting semiconductor laser device as claimed in claim 5, wherein said inorganic insulating film is formed by a plasma-assisted chemical vapor deposition method.

7. A process for producing a surface emitting semiconductor laser device comprising the steps of: laminating, on an insulating substrate, a buffer layer of a first conductive type, a distributed Bragg reflector film of said first conductive type, an active region, at least one AlAs layer in the vicinity of said active region, a distributed Bragg reflector film of a second conductive type, and a contact layer of said second conductive type; forming plural mesa structures containing from said contact layer through said distributed Bragg reflector film of said first conductive type; selectively oxidizing a part of said AlAs layer; forming, on said buffer layer, a lower electrode capable of forming an ohmic contact with said buffer layer; laminating an inorganic insulating film to cover said mesa structures; removing a part of said inorganic insulating film and said buffer layer to make said respective mesa structures independent, so as to complete said mesa structures; laminating an organic insulating film to be embedded in regions among said respective mesa structures; removing said organic insulating film until said inorganic insulating film on an upper surface of said mesa structures is exposed; removing the central part of said inorganic insulating film on said upper surface of said mesa structures; and forming an upper electrode in contact with an exposed part on said upper surface of said mesa structures.

* * * * *